United States Patent [19]
Walpole et al.

[11] Patent Number: 5,555,544
[45] Date of Patent: Sep. 10, 1996

[54] TAPERED SEMICONDUCTOR LASER OSCILLATOR

[75] Inventors: James N. Walpole, Concord; Emily S. Kintzer, Arlington; Stephen R. Chinn, Westford; Christine A. Wang, Bedford; Lee J. Missaggia, Milford, all of Mass.

[73] Assignee: Massachusetts Institute of Technology, Cambridge, Mass.

[21] Appl. No.: 222,413

[22] Filed: Apr. 4, 1994

Related U.S. Application Data

[63] Continuation-in-part of Ser. No. 148,386, Nov. 8, 1993, Pat. No. 5,400,353, which is a continuation of Ser. No. 829,778, Jan. 31, 1992, Pat. No. 5,260,822.

[51] Int. Cl.$^6$ .................................. H01S 3/18
[52] U.S. Cl. .................. 372/50; 372/19; 372/44; 372/92; 372/97
[58] Field of Search .................... 372/50, 44, 19, 372/45, 97, 99, 92

[56] References Cited

U.S. PATENT DOCUMENTS

| | | | |
|---|---|---|---|
| 3,467,906 | 9/1969 | Cornely et al. | 330/4.3 |
| 4,251,780 | 2/1981 | Scifres et al. | 331/94.5 |
| 4,389,567 | 6/1983 | Khoe et al. | 250/213 |
| 4,523,316 | 6/1985 | Botez | 372/45 |
| 4,523,317 | 6/1985 | Botez | 372/45 |
| 4,545,057 | 10/1985 | Hayakawa et al. | 372/45 |
| 4,546,481 | 10/1985 | Yamamoto et al. | 372/48 |
| 4,563,765 | 1/1986 | Tsang et al. | 372/50 |
| 4,581,742 | 4/1986 | Botez | 372/45 |
| 4,594,718 | 6/1986 | Scifres et al. | 372/45 |
| 4,689,797 | 8/1987 | Olshansky | 372/45 |
| 4,713,821 | 12/1987 | Bradford et al. | 372/44 |
| 4,744,089 | 5/1988 | Mostroll et al. | 372/50 |
| 4,942,366 | 7/1990 | Toda | 330/4.3 |
| 4,942,585 | 7/1990 | Ungar | 372/44 |
| 5,031,183 | 7/1991 | Waters | 372/45 |
| 5,084,892 | 1/1992 | Hayakawa | 372/45 |
| 5,157,544 | 10/1992 | Nitta | 359/344 |
| 5,179,568 | 1/1993 | Lang | 372/95 |

FOREIGN PATENT DOCUMENTS

| | | | |
|---|---|---|---|
| 0214866 | 3/1987 | European Pat. Off. . | |
| 0486482A3 | 1/1992 | European Pat. Off. . | |
| 57-52186 | 3/1982 | Japan | 372/46 |
| 59-44884 | 3/1984 | Japan | H01S 3/18 |
| 61-168286 | 7/1986 | Japan | H01S 3/18 |
| 02278781 | 11/1987 | Japan . | |
| 2-166785 | 6/1990 | Japan | 372/45 |
| 2264488 | 10/1990 | Japan . | |

OTHER PUBLICATIONS

Craig, R. R., "Unstable Resonator Semiconductor Lasers," Published doctoral dissertation, University of California, Los Angeles, (MI:U.M.I. Dissertation Services) pp. 1–134 (1985).

Yeh, et al., "350–dB Small–Signal–Gain High–Power Diffraction–Limited Tapered Semiconductor Amplifier," *Conference Proceeding for Sixth Annual Meeting for the IEEE Lasers and Electro Optics Society*, Nov. 15–18, 1993, pp. 588–589 (San Jose). This is an amended version of reference AR4 cited in the information disclosure statement, filed on Apr. 4, 1994.

(List continued on next page.)

*Primary Examiner*—Rodney B. Bovernick
*Assistant Examiner*—Robert McNutt
*Attorney, Agent, or Firm*—Hamilton, Brook, Smith & Reynolds, P.C.

[57] ABSTRACT

A semiconductor laser oscillator structure and method is described having a tapered gain region in one-half of a laser cavity and a confocal oscillator region in another half of the cavity. An aperture is formed between two pairs of cavity spoilers located between the two cavity halves. One pair of spoilers is provided for receiving light which is reflected off of an output facet back into the semiconductor and removing it from the gain region. The other pair of spoilers removes light reflected from a curved mirror surface formed at the end of the other laser cavity half.

42 Claims, 7 Drawing Sheets

OTHER PUBLICATIONS

K. Shigihara et al., "High–Power and Fundamental–Mode Oscillating Flared SBA Lasers," *Electronics Letters*, vol. 24, No. 18, pp. 1182–1183 (Sep. 1, 1988).

P. A. Yazaki et al., "A GaInAsP/InP Tapered–Waveguide Semiconductor Laser Amplifier Integrated with a 1.5 μm Distributed Feedback Laser," *IEEE Transactions Photonics Technology Letters*, vol. 3, No. 12, p. 1060–1063 (Dec. 1991).

G. Bendelli et al., "A New Structure for High–Power TW–SLA," *IEEE Photonics Technology Letters*, vol. 3, No. 1, pp. 42–44 (Jan. 1991).

D. Z. Tsang et al., "Intracavity Loss Modulation of GaInAsP Diode Lasers," *Appl. Phys. Lett.*, vol. 38, No. 3, pp. 120–201, Abstract, (Feb. 1981).

J. Z. Wilcox et al., "High–Efficiency Power Output from Unstable Resonator Semiconductor Lasers," *STS Press*, Mclean, VA., TRW Space Tech. Group. pp. 386–390, Abstract, (1986).

J. N. Walpole et al., "Single–Spatial–Mode Tapered Amplifiers and Oscillators," *SPIE* vol. 1850 Laser Diode Technology and Applications V, pp. 51–59 (1993).

D. F. Welch et al., "1.1 W CW Diffraction–Limited Operation of a Monolithically Integrated Flared–Amplifier Master Oscillator Power Amplifier," *Electronics Letters*, vol. 28, No. 21, pp. 2011–2013 (Oct. 8, 1992).

J. N. Walpole et al., "High–Power Strained–Laser InGaAs/AlGaAs Tapered Traveling Wave Amplifier," *Appl.Phys..Lett.* 61 (7), pp. 740–742 (Aug. 17, 1992).

E. S. Kintzer et al., "High–Power, Strained–Layer Amplifiers and Lasers with Tapered Gain Regions," *IEEE Photonics Technology Letters*, vol. 5, No. 6, pp. 605–608 (Jun. 1993).

Z. L. Liau et al., "A Novel GaInAsP/InP Distributed Feedback Laser," *Appl.Phys.Lett.* 46(3), pp. 221–223 (Feb. 1, 1985).

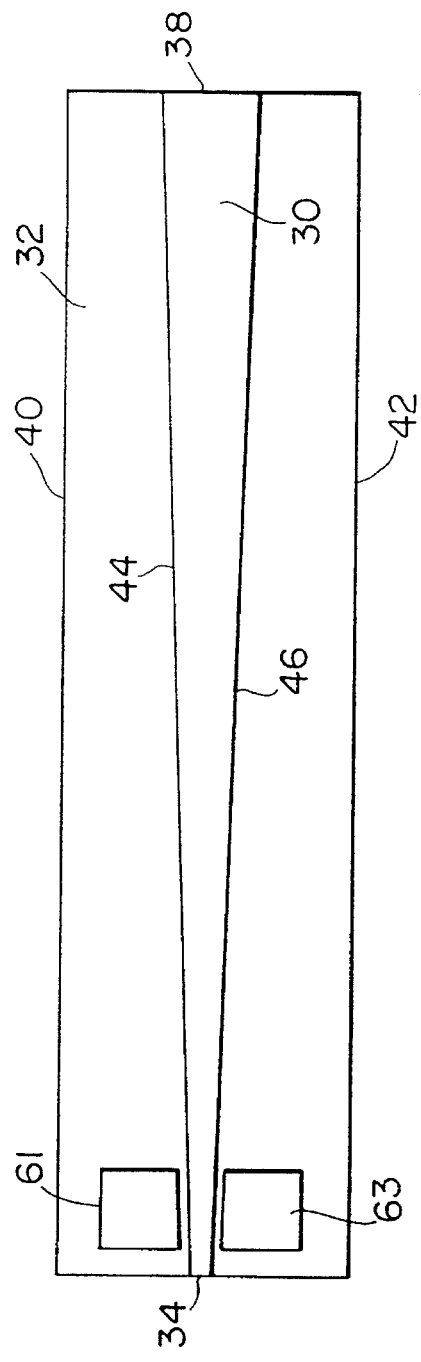
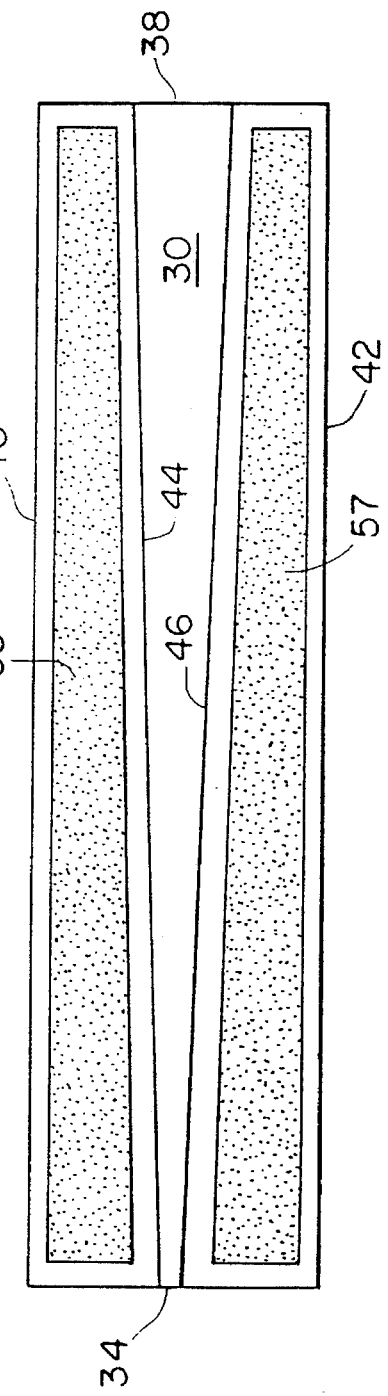
FIG. 3
FIG. 4

TAPERED SEMICONDUCTOR LASER OSCILLATOR

GOVERNMENT SUPPORT

This invention was made with government support under Contract Number F19628-90-C-0002 awarded by the Air Force. The government has certain rights in the invention.

RELATED APPLICATIONS

This is a continuation-in-part of U.S. Ser. No. 08/148,386 filed Nov. 8, 1993 (now U.S. Pat. No. 5,400,353) which is a continuation of Ser. No. 07/829,778 filed Jan. 31, 1992 (now U.S. Pat. No. 5,260,822) (each of which is incorporated herein by reference).

FIELD OF THE INVENTION

The invention pertains to semiconductor laser oscillators and integrated master-oscillator/power amplifiers (MOPA's).

BACKGROUND OF THE INVENTION

Semiconductor laser oscillators (i.e., laser light sources) and semiconductor laser amplifiers were first developed in the 1960s. Such laser oscillators and amplifiers offered the obvious advantage of extremely small size over other types of lasers. (A typical semiconductor amplifier may be on the order of few hundred micrometers long). These first semiconductor lasers were fabricated of a single type of semiconductor.

A modern semiconductor laser oscillator or amplifier typically comprises a semiconductor heterostructure, that is, it is made from more than one semiconductor material such as gallium arsenide (GaAs) and aluminum gallium arsenide (AlGaAs). Semiconductor oscillators and amplifiers are made from a combination of semiconductor materials which have different bandgap energies to achieve amplifiers are made from a combination of semiconductor materials which have different bandgap energies to achieve electrical carrier confinement as well as different optical indices of refraction to achieve optical confinement.

Many approaches have been proposed to achieve the goal of high-power, continuous-wave operation with a single-lobed spatial mode output from semiconductor lasers or semiconductor amplifiers. One such approach is to employ a laterally tapered gain region.

An exemplary double heterostructure tapered amplifier of the prior art is comprised of three layers of semiconductor material; 1) a p-type material with a relatively high bandgap, such as AlGaAs, 2) and n-type material with relatively high bandgap, which may also be AlGaAs, and 3) a relatively low bandgap p-type material such as GaAs, sandwiched between the other two layers and comprising the active region of the amplifier.

In general, any direct-band-gap semiconductor ternary or quaternary alloy system (such as AlGaAs or InGaAsP whose various alloys can be selected to have lattice constants close to that of the growth substrate crystal can be used for laser amplifiers or oscillators.

A linearly tapered gain region is formed in the active layer. Commonly, the gain region is formed by etching through the active layer and regrowing another semiconductor layer in the etched region. A metal contact pad is placed in electrical contact with the top surface of the top layer commensurate with the underlying gain region. When sufficient current is passed through the metal contact, electrons and holes are injected into the active layer in the gain region from the high bandgap material layers. These electrons and holes are trapped in the potential well created by the low bandgap GaAs material. Since the electrons are trapped in the active region they are forced to combine with each other in the GaAs material. Light introduced into this region is amplified.

Confinement of the light around the GaAs active layer is provided by the wave guide properties of the AlGaAs/GaAs/AlGaAs material structure. The AlGaAs layers have a lower optical index of refraction than that of the GaAs material thus providing total internal reflection of light off the interfaces so that most of the light remains within the GaAs layer allowing the active layer to act essentially as a wave guiding layer.

In operation, substantially diffraction limited light generated, for example, by a low power laser is focused by a lens system onto the input facet of the tapered amplifier. If the beam is allowed to spread naturally without interference, the beam will remain diffraction-limited as it spreads, thus leading to the desired single-mode amplified output beam. The expansion of the beam reduces the possibility of optical damage at the output facet because the power in the beam is more spread out.

Due to the high gain achieved by semiconductor optical amplifiers, such amplifiers are easily susceptible to self-oscillation. Self-oscillation occurs when a small portion of the light striking the output facet is reflected back into the semiconductor medium. This reflected light is further amplified and a portion reflected again off of the input facet. If the total round trip product of amplification gain and reflection loss reaches unity, self-oscillation occurs. In this case, self-oscillation will build up from internal spontaneous emission, even in the absence of externally injected light.

In the case of semiconductor laser oscillators as opposed to amplifiers, self-oscillation is necessary and, in fact, constitutes laser action. However, self-oscillation is undesirable in semiconductor amplifiers because it interferes with the amplification of the input light and may degrade the output mode quality as well as reduce gain.

This problem can be partially alleviated by using anti-reflection coatings on the input and output facets 20 and 22. However, a sufficiently small residual reflectivity is often difficult to achieve in practice and, in fact, may be impossible to incorporate in certain monolithic implementations where a MOPA is integrated on a chip. The problem is particularly severe in long amplifiers where the larger gains achieved can easily overcome very small reflection coefficients.

Examples of the state of the art of tapered semiconductor laser amplifiers are Bendelli, G., Komori, K., Arai, S., and Suematsu, Y., *A New Structure For High-Power TW-SLA*, IEEE Photonics Technology Letters, Vol. 3, No. 1, Jan. 1991, which discloses an exponentially tapered semiconductor laser amplifier having a high refractive index gradient at the boundaries of the tapered gain region; and Yazaki, P., Komori, K., Bendelli, G., Arai, S., and Suematsu, Y., *A GaInAsP/InP Tapered Waveguide Semiconductor Laser Amplifier Integrated with a 1.5 μm Distributed Feedback Laser*, IEEE Transactions Photonics Technology Letters, Vol. 3, No. 12, Dec., 1991, which discloses an exponentially tapered wave guide semiconductor laser amplifier monolithically constructed with a distributed feedback laser. The Yazaki, et al. device also has a high refractive index gradient at the boundaries of the gain region.

SUMMARY OF THE INVENTION

The invention comprises a tapered semiconductor gain structure which can be utilized as a semiconductor laser amplifier or a semiconductor laser oscillator. Operating as either an amplifier or an oscillator, the present invention provides an output beam which has both high power and good beam quality. As used herein, the term "beam quality" refers to the smoothness of the amplitude and phase distribution in the lateral direction (i.e., perpendicular to the direction of propagation and parallel the wave guiding active layer of the semiconductor). Beam quality along the axis perpendicular to the wave guiding layer and to the direction of propagation is determined by the wave guiding layer and can be made single lateral spatial mode. Accordingly, the smoother the amplitude and phase distribution in the lateral direction, the better the beam quality. The ideal output would be a beam without nulls in the amplitude or reversals of phase, such that, in the far field, the beam is single lobed and diffraction limited.

A first embodiment of the invention comprises a semiconductor gain structure employing a tapered gain region between input and output facets. The lateral dimension of the gain region of the semiconductor is defined by a tapered electrical metal contact pad on the surface of the semiconductor through which a current is forced to flow. The semiconductor regions on opposite sides of the gain region, where no current flows, have intrinsic inter-band absorption loss.

A wave guiding layer is constructed by selective layering of semiconductor materials. Light having high beam quality is focused onto the input facet adjacent the gain region and propagates freely down the tapered gain region expanding by diffraction and gaining in power. There is no intentionally imposed refractive index gradient at the boundary of the gain region. The gain region is defined solely by the electrical contact. Accordingly, the amount of light reaching the gain structure's lateral boundary which is reflected into the gain structure is minimized, thereby reducing interference between reflected light and the amplified input light and generation of amplitude and spatial phase variations.

Further, light removers in the form of cavity spoilers are positioned in the semiconductor on opposite sides of the gain region. The cavity spoilers are normally positioned to receive as much of the light which is reflected off of the output facet back into the semiconductor as possible. The cavity spoilers may comprise light reflecting means, light scattering means, or light absorbing means so as to remove the light they receive from the semiconductor. Light absorbing means may comprise reverse biased junctions or ion implanted regions. Reflecting/scattering means may comprise any means for causing a sharp change in the refractive index in the wave guiding layer.

A preferred embodiment of the cavity spoilers comprises grooves etched through the wave guiding layer so as to define reflective surfaces at the edges of the grooves. The grooves are positioned so as to receive the majority of light which reflects off of the output facet back into the semiconductor. The grooves are angled to reflect that light away from the gain region and primarily into the substrate or the non-reflective lateral edges. Accordingly, undesirable self-oscillation is significantly reduced since the majority of the light which is reflected back from the output facet is directed by the etched grooves away from the gain region and prevented from striking the input facet.

When the device is used as a laser amplifier, both the input and output facets are anti-reflection coated.

However, when the device is used as a laser oscillator, only the output facet is anti-reflection coated. The input facet may not be coated or may be coated with a reflective coating. Thus, a sufficient portion of the light which is reflected off of the center of the output facet back towards the input facet between the cavity spoiling grooves is again reflected back into the semiconductor cavity resulting in oscillation. Most of the light reflected off of the non-central part of the output facet is not returned to the input facet, but strikes the spoiling grooves and is directed thereby away from the gain region. By virtue of oscillating with only the light striking the centermost portion of the output facet, oscillation of higher order spatial modes is suppressed.

In another laser oscillator embodiment of the invention the resonant cavity is divided into two halves or regions. The first region extends longitudinally from a first reflective surface formed at a first longitudinal end of the gain region, defined by the contact pad, to an aperture in the gain region. The second region extends from the aperture to a second reflective surface formed at a second longitudinal end of the gain region. Light removers are formed adjacent the aperture. The contact pad extends in opposite directions from the aperture. The contact pad is narrowest at the aperture and widest at the reflective surfaces which form the longitudinal boundaries of the cavity. In this laser oscillator embodiment, the second reflective surface is the output surface and hence is formed with reduced reflectivity. Optical energy generated in the gain region, when current is supplied to the contact pad, is incident on the second reflective surface. Only a small fraction of that energy is reflected back from the output surface toward the first reflective surface. That surface is perpendicular to the direction of propagation of the beam but is curved along the width dimension to conform with the constant phase surface of a two-dimensional beam whose waist is at the center of the aperture. In this manner a half confocal cavity is formed in the first region between the aperture and the curved first reflective surface.

BRIEF DESCRIPTION OF THE DRAWINGS

FIG. 3 is a plan view of a second embodiment of the semiconductor gain structure of the present invention.

FIG. 4 is a plan view of a third embodiment of the semiconductor gain structure of the present invention.

DETAILED DESCRIPTION OF THE INVENTION

Figure 1:
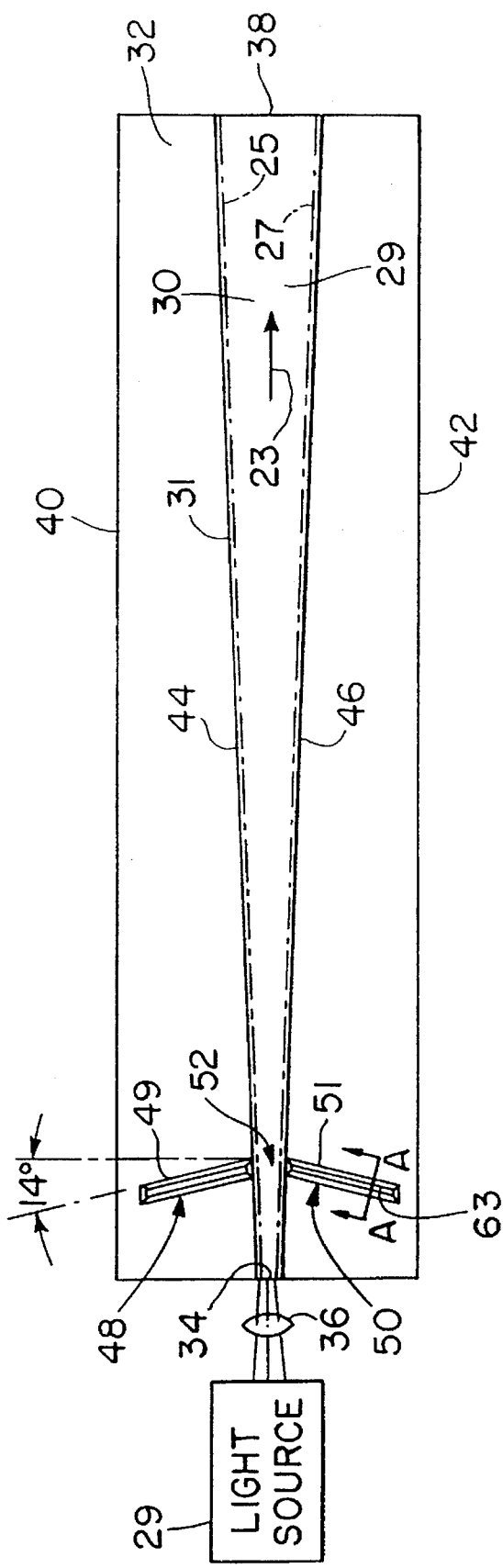
FIG. 1 is a plan view of a semiconductor gain structure of the present invention configured as a laser amplifier.
Figure 2:
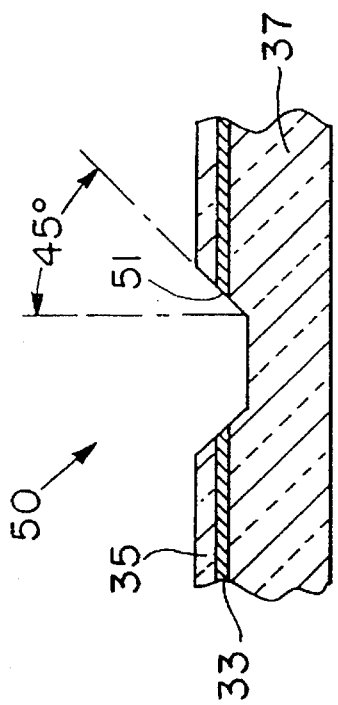
FIG. 2 is a cross-sectional view taken along lines A—A of FIG. 1.

Various embodiments of this invention will now be described in detail in connection with the drawings. FIG. 1 is a plan view of the semiconductor laser amplifier of the present invention. FIG. 2 is a cross-sectional view taken along lines [A—A] of FIG. 1. The semiconductor layer structure comprises a composite gain layer 33 sandwiched between two layers of oppositely doped high bandgap material 35 and 37. In the preferred embodiment, the active layer comprises a single quantum-well of $In_xGa_{1-x}As$ embedded in a composite $GaAs/Al_yGa_{1-y}As$ structure which provides optical and carrier confinement. Note: $0<X>1$ $0<Y>1$. Other active layer structures are also possible as described in the background section.

A tapered electrically conductive contact 30 is placed on surface 32 of the semiconductor structure. Contact 30 extends over the active layer and defines a tapered gain region 31 which is commensurate with the contact 30 and is shown in phantom by dotted lines 25 and 27 in FIG. 1. The edges 44 and 46 of contact 30 essentially overlay phantom boundaries 25 and 27 of the gain region 31. Ideally, the degree of taper of the contact (and consequently gain region 31) is selected so as to allow the input beam to spread naturally such that its light intensity profile has no nulls when it reaches output facet 38. Contact 30 may be formed of a suitable conductor, such as, metal.

Light from a laser source 29 is introduced to input facet 34 through focusing lens 36. Input and output facets 34 and 38 are preferably cleaved. Alternately, they may be etched into a wafer. The input and output facets 34 and 38 are shown in FIG. 1 as planar. However, one or both of the facets may be curved. The lateral edges 40 and 42 of the semiconductor are preferably saw-cut from a wafer.

No intentional gradient in the refractive index of the material is imposed at the boundaries 44 and 46 of the gain region. Accordingly, reflectivity at the gain region boundaries 44 and 46 is minimized. The boundaries 44 and 46 of the gain region are defined solely by conductive metal contact 30.

Reflective cavity spoiling grooves 48 and 50 are etched through the wave guiding layer so as to form surfaces 49 and 51 which are formed through the wave guiding layer. The grooves are positioned so as to receive a majority of the light reflected off of the output facet 38 before it is returned to the input facet 34. In order to receive the most light possible, the grooves should be positioned close to the input facet where the gain region is the most narrow and should extend substantially from the boundaries of the gain region 44 and 46 to the lateral edges 40 and 42 of the semiconductor. In this manner, only the light which is returned in the central portion of the gain region through narrow gap 52 between the cavity spoiling grooves 48 and 50 reaches input facet 34.

Although there is intrinsic inter-band absorption loss outside of the gain region, such inter-band absorption can be saturated by the electromagnetic fields which build up in the gain region. Accordingly, in the absence of the cavity spoilers of the present invention, self-oscillation can occur despite inter-band absorption.

The grooves are etched at an angle such that surfaces 49 and 51 reflect and/or scatter the light they receive away from the gain region. A gap 52 is provided between the grooves 49 and 51 to allow the input light to propagate between the grooves down the gain region. The grooves should preferably be etched, or otherwise formed, at an angle to deflect the light they receive towards the sides of the semiconductor (e.g., saw-cut sides 40 and 42) and/or out of the plane of the active layer (e.g., towards the substrate). Accordingly, the particular orientation of the grooves depends upon the relative angle of the output facet, the diffraction angle of the light and, consequently, the angle of taper of the gain region.

In at least one preferred embodiment, the grooves are angled at 14° from the plane parallel to the output facet 38 and 45° from the plane of the wave guiding layer as shown in FIG. 4. Accordingly, in this embodiment, the reflecting surfaces 49 and 51 tend to deflect the light both out of the active layer and towards the sides 40 and 42.

Precision groove etching is only one way to create reflective surfaces for cavity spoiling purposes. Any other means for creating a sharp change in refractive index in the wave guiding layer so as to create a reflective surface may also be used.

Alternately, the cavity spoilers may comprise means for absorbing the light, such as reverse biased junctions formed in the active wave guiding layer as shown in FIG. 3. To create reverse biased junctions, electrodes 61 and 63 are placed on the top surface of the semiconductor and supplied with a reverse biasing voltage.

It is also possible to form cavity spoilers on opposite sides of the gain region along the entire length of the gain region to absorb the light reflected off the end facet 38. In this full length type of embodiment, the cavity spoilers can be formed by a reverse biased junction along the entire length of the gain region. Alternately, ion implanted regions, such as regions 55 and 57 in FIG. 4, can be formed adjacent the gain region 30. The ion implantation decreases the carrier lifetime in the implanted region and makes saturation of the absorption region very difficult. Note: It is not necessary to form these spoilers along the entire length. Similarly to reverse biased junctions, ion implanted regions will absorb the light which enters them. Proton bombardment is one exemplary means for creating ion implanted regions. However, other types of ion implantation techniques may also be used.

When the gain structure is utilized as an amplifier, both the input facet 34 and the output facet 38 are coated with an anti-reflection coating so as to minimize reflection off of these surfaces. Nevertheless, some light is reflected off of the output facet 38 and returned into the semiconductor towards the input facet 34. The majority of such light will strike the cavity spoiling grooves 48 and 50 (See FIG. 1) whereupon it will be reflected off of the etched grooves either towards the saw-cut edges 40 and 42 and/or down into the substrate (not shown). The small amount of light which passes through the gap 52 between the grooves strikes the input facet which is also coated with an anti-reflective coating. Accordingly, since the majority of light reflected off of output facet 38 strikes the cavity spoiling grooves, the amount of light which can oscillate within the semiconductor is significantly reduced. The light absorbing embodiments of FIGS. 3 and 4 function in a similar way to eliminate oscillations.

By having the smallest possible index gradient at the boundaries 44 and 46 of the gain region, excitation of high-order modes is substantially eliminated. Such modes are undesirable, as they detract from the spatial beam quality.

However, since there is no intentionally imposed refractive index gradient at the boundaries, most of the light which strikes the boundary simply passes through it rather than being reflected back into the gain region. A small amount of index guiding may be unavoidable due to thermal effects caused by the current flowing through the contact pad 30 as well as gain saturation effects and strain effects. Nevertheless, these effects would only cause a small fraction of the output power to fall outside of the main spatial mode.

Figure 5:
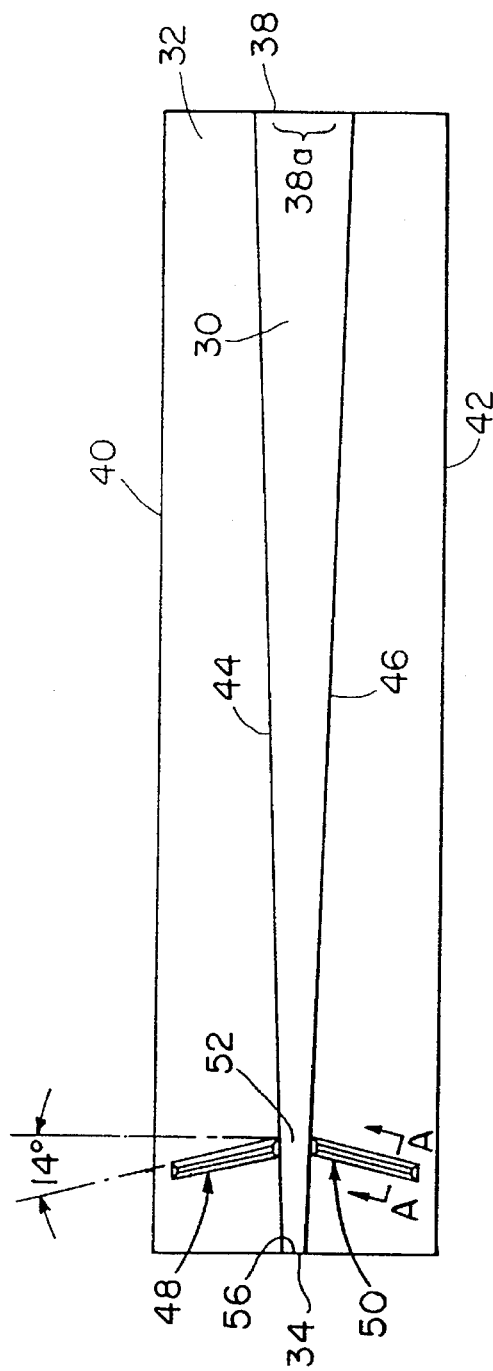
FIG. 5 is a plan view of a fourth embodiment of the semiconductor gain structure of the present invention configured as a laser oscillator.

The gain structure disclosed herein may also be modified for use as a laser oscillator, i.e., a laser light source. FIG. 5 is a plan view of the gain structure of the present invention modified to achieve a controlled self-oscillation in a single-lobed spatial mode so as to achieve lasing action. In FIG. 5, like features are indicated with the same reference numerals as in FIG. 1. The structure is essentially identical to the FIG. 1 embodiment except that no input light source is provided and the previous input facet is replaced with interface 56. Interface 56 may be an etched or cleaved facet which may or may not be coated with reflection coatings in order to provide sufficient reflectivity. Alternately, interface 56 may be adjacent a diffraction grating. Accordingly, a significantly greater portion of the light reflected off of the output facet which is returned between the cavity spoiling grooves to facet 56 is reflected back into the semiconductor. Accordingly, a sufficiently large amount of feedback is allowed so that lasing may occur.

The employment of the etched grooves in this configuration as an oscillator leads to a predominantly single-lobed output beam. As previously explained, the majority of the light which is reflected off of the output facet 38 strikes the etched grooves 48 and 50 and is directed out of the semiconductor. Only the portion of the light which strikes the output facet 38 very close to its center, as illustrated at 38a in FIG. 5, can pass through the gap 52 between the etched grooves 48 and 50 and strike the interface 56.

Figure 6:
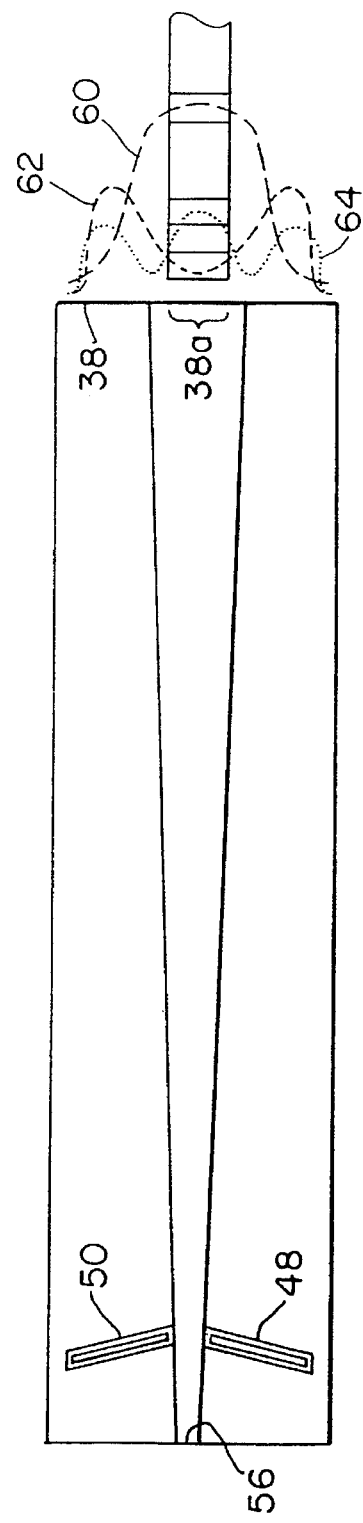
FIG. 6 is an illustration of exemplary light distributions of light traveling in the laser oscillator of FIG. 4.

Curve 60 in FIG. 6 illustrates an exemplary spatial light intensity distribution of light propagating in the gain region in the lowest order spatial mode. Higher order spatial modes do not oscillate because they do not have sufficient gain in the cavity design. Dashed curve 62 and dotted curve 64 illustrate the spatial light intensity distributions of the non-oscillating next two higher order spatial modes. As can be seen by the juxtaposition of curve 60 with the center portion 38a of the output facet 38, an extremely flat portion of the light intensity distribution curve of the lowest order mode 60 strikes the output facet in the center region 38a (i.e., the region which will return light to interface 56 for oscillation).

It can also be seen with respect to the second and third order modes shown by curves 62 and 64 that the light intensity distribution in region 38a is not as uniform as curve 60. Accordingly, higher spatial mode suppression is achieved for two primary reasons. First, a much lower amount of light energy in the higher modes is returned to the input facet 56. Second, the light of the lowest order spatial mode which is returned to the input facet is extremely uniform in intensity because the flattest portion of the light distribution curve strikes region 38a of the output facet 38. Accordingly, oscillation of light of extremely uniform light distribution occurs, thus leading to superior suppression of high order modes.

Figure 7:
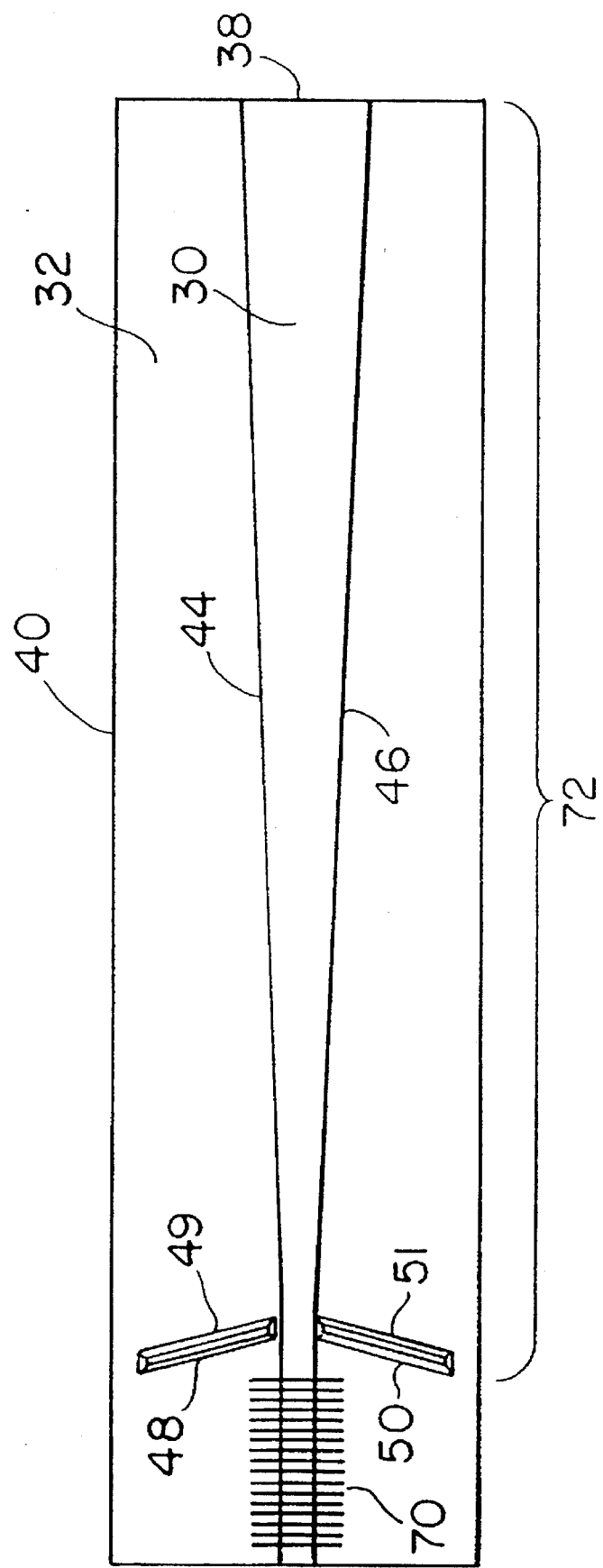
FIG. 7 is a plan view of a fifth embodiment of the semiconductor gain structure of the present invention configured as a monolithically integrated MOPA.

The gain structure disclosed herein may also be used in a monolithically integrated master oscillator/power-amplifier combination as illustrated in FIG. 7. The amplifier section 72 operates in the same fashion as previously described. However, the input light, instead of being focused into the amplifier from a separate, external light source, is introduced within the same wave guiding layer from a semiconductor laser oscillator 70 incorporated in the same chip as the amplifier. The oscillator output should be constrained to the lowest order spatial mode of its structure. Preferably, separate electrical contacts to the oscillator and amplifier are used in order to control independently the currents in each section. The master oscillator 70 and power amplifier 72 may be adjacent to each other on the chip, as shown, or may be connected by an optical wave guide. An integrated lens may also be included between the output of the master oscillator and the input of the amplifier.

The feedback in the master oscillator which causes it to lase may be of the reflective type (cleaved or etched facets, or Bragg grating reflectors) or of the distributed feedback type (a grating located within and along the entire length of the master oscillator). Through proper design of the master oscillator, single frequency and lowest order spatial mode operation is obtained.

In this monolithic implementation, the reflectivity at the output of the master oscillator is the same as the reflectivity at the input of the power amplifier. In order to avoid self-oscillation of the power amplifier, sufficient power must be introduced from the master oscillator to saturate the amplifier gain in the desired amplified mode. Further, the self-oscillation threshold of the amplifier may be further reduced by using better anti-reflective coating on the output facet or by tilting or curving the output facet with respect to the axis of propagation of the light.

Figure 8:
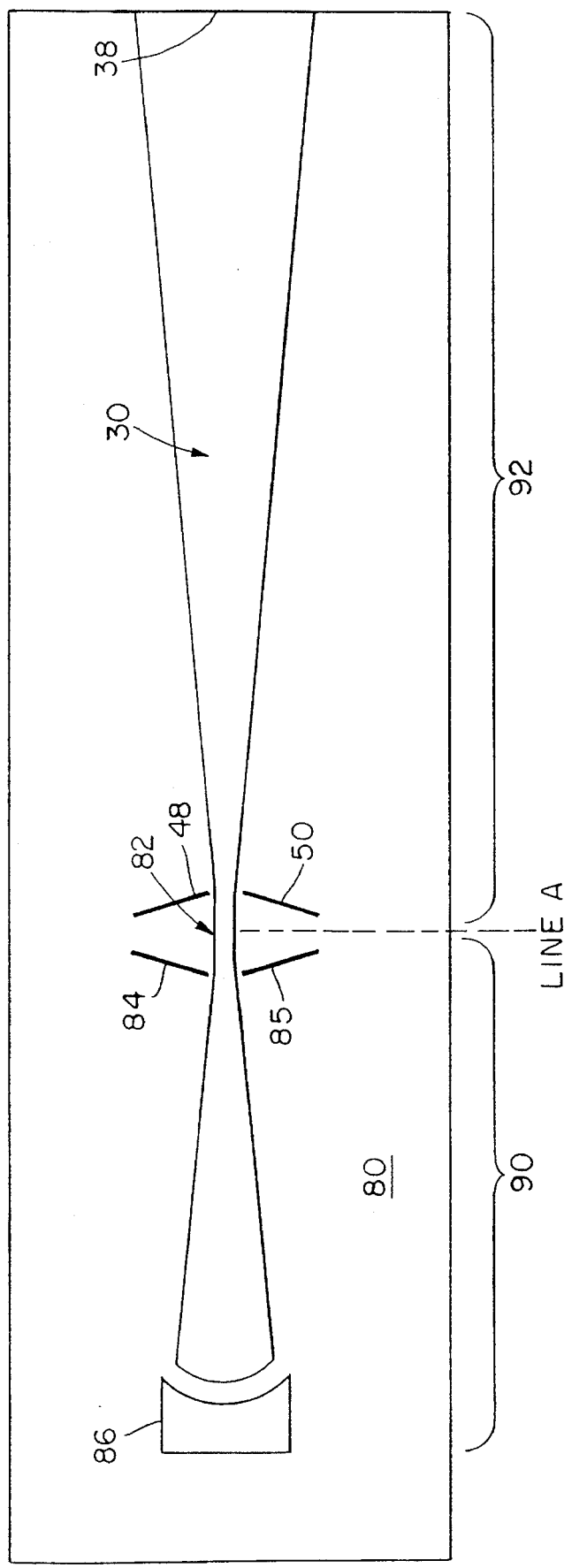
FIG. 8 is a plan view of a tapered gain structure laser oscillator embodiment of the invention as seen from the top of a wafer on which the device is fabricated.

FIG. 8 shows an alternate embodiment of a tapered oscillator as seen looking down on the top of wafer in which the device is fabricated. The contact pattern 30, cleaved facet 38 and cavity spoiling grooves 48 and 50 are formed as previously described.

The cavity of FIG. 8 is formed of two half cavities 90 and 92. Half-cavity 92 is defined at the right end by an output facet 38 which is coated to have reduced reflectivity (~a few percent). As in the previous oscillators of FIGS. 5–7 with the tapered design, only a small fraction of the optical energy incident at the output facet 38 is reflected back into the cavity. An even smaller fraction is fed back into the narrow opening or aperture 82 between the etched cavity spoiling grooves 48, 50. This energy is nearly uniform in intensity across the opening 82 between the grooves. In the previous oscillators another facet was cleaved across the device running through the narrow grooves section to form the other end of the optical cavity. In the present embodiment the contact 30 widens and tapers out again to the second half-cavity 90 as the reflected radiation proceeds to the left in the absence of a second cleaved facet. In this half cavity, the reflected radiation is amplified and returned by the curved surface of mirror 86. Also, spatial filtering occurs because higher order modes will be subjected to greater loss due to diffraction effects in higher order modes. Also another set of cavity-spoiling grooves 84, 85 is provided, as shown, to further suppress unwanted radiation. At the left end of the cavity a curved mirror 86 is etched into the wafer to provide feedback towards the right end of the cavity to sustain oscillation. This mirror 86 is vertical in cross section just as a cleaved facet would be but following a curve, as shown. This mirror is curved to conform with the constant phase surface of the lowest order mode of a two-dimensional beam whose waist is at the center of the aperture 82 and along the line A of the narrow tapered contact. High reflectivity coatings may be applied to the mirror 86 to improve reflectivity.

This device should improve the power available in the central lobe of the output beam as well as the angular width of the central lobe. In present devices formed in accordance with the other embodiments the angular width of the central lobe increases from nearly diffraction limited as output powers of ~1W to 1.3 times diffraction limited at 3.5 W. The fraction of the energy in the central lobe drops from about 90% to <60% in the same range. The confocal half-cavity 90 added on the left side of FIG. 8 will provide the following improvements.

1) The power density at the etched facet can be reduced compared to that of the previously cleaved facet since the optical field can be spread over a wider region than the narrow region between the cavity spoilers (the beam waist) where the previous cleave was located. The laser power density yields higher-power operation before reaching limits due to facet power density.

2) Additional mode filtering (beyond that provided by the cavity spoilers) can be obtained by adjusting the angular width of the taper and the angle subtended by the etched mirror 86 in the confocal half-cavity 90. The additional mode filtering yields output beams closer to diffraction limited at higher power levels.

3) Additional gain is available so that the power launched back into the half-cavity 92 will be much larger than in the case in which a cleaved facet is provided at the waist aperture 82. The larger power maintains saturation over the length of the cavity, thus suppressing other modes of oscillation and filamentation which add energy to the side lobes and broaden the central lobe.

The net result is higher beam quality at higher power.

The mode filtering mentioned in the second item above refers to the rejection of high spatial frequency components that may occur in the waist region by the finite angular width subtended by the etched mirror 86. In addition, one may also optimize the beam shape launched back into the right half-cavity by varying that angle, i.e., optimize the mode match with respect to the beam that is launched into the other half side 92 of the device. This type of control over beam waist location and size emulates the control obtained when injecting an external oscillator into the tapered amplifier [FIG. 1] This type of operation (FIG. 8) has yielded the best beam quality of any tapered devices at powers up to 3.5 W cw. Such control in matching the amplified mode is not possible if one uses a single mode dielectric wave guide for a mode filter or an integrated master oscillator.

Figure 9:
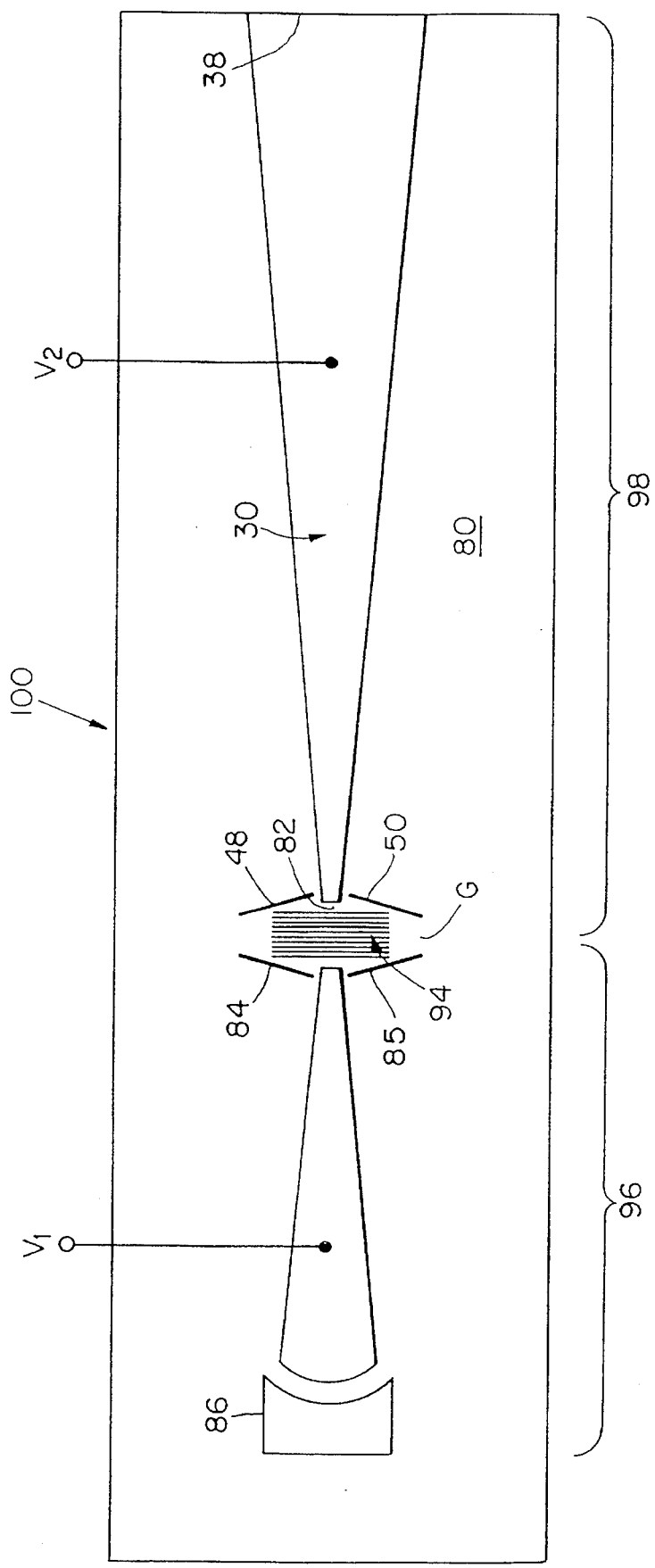
FIG. 9 is a plan view as in FIG. 1 of an integrated MOPA embodiment of the invention.

To provide an integrated MOPA 100 one need only add a grating 94 in the waist region where the wavefronts are parallel as shown in FIG. 9. The grating 94 provides feedback to the master oscillator section 96 causing it to lase. As in FIG. 7, the grating may be of the distributed feedback type. The master-oscillator cavity is formed between the etched curved mirror 86 on the left and the grating 94 in the waist region. The useful extent of the grating is determined by the Rayleigh length which typically would be on the order of a few hundred microns. Alternatively, the etched curved mirror could be replaced by another grating with curved grooves whose curvature also would conform to the appropriate constant phase contours of the beam and would be spaced approximately radially by the same linear spacing as the grooves of the grating 94 in the waist region.

This MOPA has all the advantages described above for the oscillator. In addition, the grating 94 provides further mode filtering and the mode of operation even more nearly emulates the hybrid MOPA operation which is most successful in maintaining high beam quality at high power.

AS shown in the FIG. 9, the contact 30 is not continued into the grating region G. This region will be easily bleached to transparency by the radiation incident on it from the master oscillator, without injecting current directly into it. The break in the contact 30 then allows electrically separate contacts and hence voltage (V1 and V2) to be applied to the master oscillator section 96 and the power amplifier section 98. Since no contact is required to this region and since the region is accessible to photolithographic masking and holographic exposure, the gratings can be defined and etched into this region after all growth has been done rather than forming the gratings in a thin layer near the active region and then regrowing cladding and contact layers over the grating. The latter procedure is more difficult, especially in Al-containing alloys, and there is an important advantage for manufacturability in the avoidance of epitaxial regrowth.

In early experimental embodiments of the gain structure disclosed herein the laser amplifier of FIG. 1 was implemented. Total continuous wave output power in excess of 1.4 watts with 1.2 watts contained in a single-lobed spatial mode was achieved. More recently, a power of 3.5 watts with 3.1 watts in a single lobe was achieved.

In this implementation, the reflective cavity spoiling grooves were fabricated by a reactive ion etching (RIE) process with the use of an oxide etch mask. The RIE system was operated at 28 mTorr pressure with a $H_2:CH_4$ plasma established by a 4:1 gas-flow ratio and an rf power of 0.9 watts/cm$^2$. The wafer was then coated with 300 nm of $SiO_2$. The linearly tapered contact pad was formed using photolithography to open the tapered pattern in the oxide. Metals (Pt/Au) were evaporated over the entire wafer making ohmic contact to the tapered region. The semiconductor amplifier was fabricated from InGaAs/AlGaAs graded-index separate-confinement heterostructure single-quantum-well semiconductor material. This type of strained-layer quantum well material has been shown to be inherently more reliable than conventional unstrained GaAlAs material. The device was 2 mm long and 200 µm wide at the broadest part of the taper. The input and output facets were cleaved and anti-reflection coated with a quarter-wave layer of $SiO_x$, where x is adjusted to give an index near 1.8, with a residual reflectivity estimated to be approximately 1%. The wavelength of operation for this embodiment was between 970 nm and 980 nm.

Figure 10:
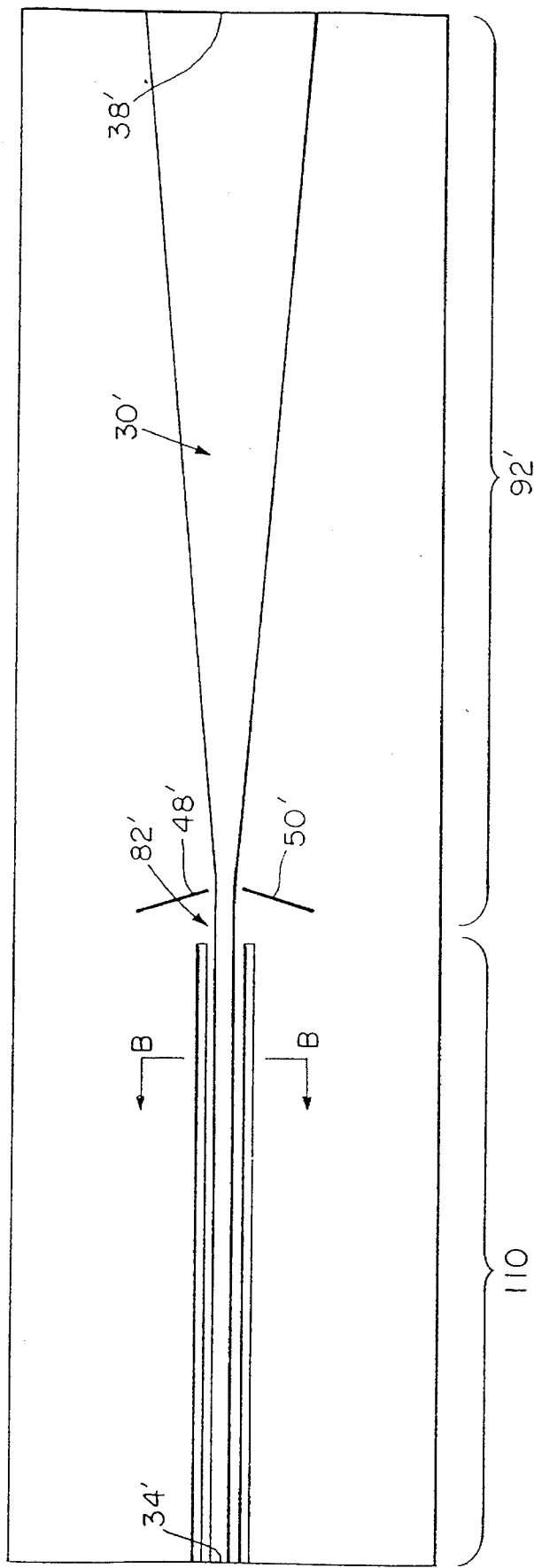
FIG. 10 is a plan view of an alternate embodiment of the gain structure of FIG. 8.
Figure 11:
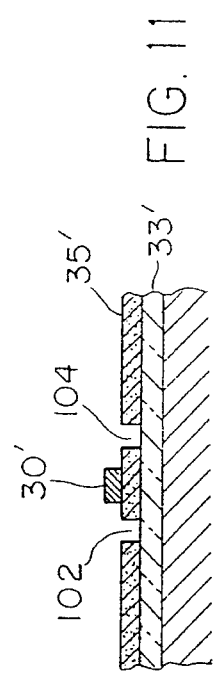
FIG. 11 is a cross-sectional view taken along lines B—B on FIG. 10.

As an alternate to the dual tapered coating shown in FIGS. 8 and 9, a single mode wave guide cavity 110 may be formed, as shown in FIGS. 10 and 11. As shown therein, a wave guide cavity 110 extends from a cleaved end surface 34' to aperture 82' adjacent spoilers 48' and 50'. The wave guide cavity 110 is formed by etching grooves 102 and 104 in the cladding layer 35' above the active layer 33. A contact 30' extends longitudinally along the top of the material 35 between the two grooves 102. Wave guide cavity 110 provides extra gain, reflective feedback and mode-filtering for the amplifier cavity 92'.

Using the inventive gain structure disclosed herein as a high power oscillator rather than an amplifier by applying the anti-reflection coating only to the output facet, an output power of 0.95 watts continuous wave has been achieved with a 1.5× diffraction limited output.

The inventive gain structure disclosed herein has wide applications. Depending on the composition and thickness of the active layers of the semiconductor material, the amplifiers can be made to operate at wavelengths in the 0.8 to 1.0 µm range. Accordingly, the present invention can be used as an amplifier or as an oscillator suitable for pumping rare-earth doped fiber amplifiers where high-spatial mode quality is required. In addition, these devices can be used in other pumping applications such as solid-state laser pumps, and particularly in end-pumped geometries. Since high spectral purity and high modulation rates can be achieved by controlling the master oscillator characteristics, these amplifiers can be used to build high-power transmitters for free-space optical communication systems. High-power diffraction limited diode sources may also be useful for efficient frequency-doubling in the blue-green region of the spectrum in optical-disk-memory and other applications.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. For example, while the contact taper has been described in connection with a linear taper other types of taper may be employed where linearity is not desired. The contact could be tapered super linearly or sub linearly (i.e. the width, W, could increase with the length, L, as

$$W = \text{constant} \times L^n,$$

where n=1 for a linear taper n>1 for a super linear taper, and n<1 for a sub linear taper.) The taper could have some other functional form such as an exponential dependence on length. In general practice the linear taper is preferable as the easiest to predict and model performance. Also, the contact need not be a continuous pad, but may be longitudinally or laterally segmented as desired.

The cavity halves may not necessarily be equal to one-half of the full cavity in length. Accordingly, the foregoing description is by way of example only, and not limiting. The invention is limited only as defined in the following claims and equivalents thereto.

What is claimed is:

1. A semiconductor laser structure comprising:
   a) a semiconductor body having a resonant cavity formed of first and second resonant cavity sections formed in said body said body having longitudinally extending outer surfaces, one said outer surface having a width W1, and a wave guiding layer between said outer surfaces in which layer electromagnetic radiation travels longitudinally along said cavity; said first section being formed of a first interface end and an aperture and said second section being formed of a second interface end and said aperture;
   b) said electrically conductive contact joined to one of said ends of said semiconductor body and extending along said one outer surface, said electrically conductive contact being tapered in two directions such that said contact has a width W2 at the ends and a width W3 at the aperture;
   c) a portion of said wave guiding layer vertically adjacent and contiguous with said contact comprising a tapered gain region of said layer which is solely defined laterally by the contact and wherein W1 is greater than W2 which is greater than W3.

2. The oscillator of claim 1 including a radiation remover to receive and remove unwanted portions of the electromagnetic radiation reflected off each of said ends to remove such unwanted portions from the wave guiding layer.

3. A semiconductor laser oscillator as set forth in claim 2 wherein said radiation remover comprises two cavity spoiling structures formed in said wave guiding layer on opposite sides of said aperture.

4. A semiconductor laser oscillator as set forth in claim 3 wherein said radiation remover comprises an absorber for absorbing said light received by said cavity spoiling structures.

5. A semiconductor laser oscillator as set forth in claim 2 wherein said cavity spoiling structures comprises reflective surfaces formed in said wave guiding layer disposed at an angle to the path of said radiation.

6. A semiconductor laser oscillator as set forth in claim 1 wherein a space is formed in said contact at said aperture and a grating formed in said wave guiding layer adjacent the space.

7. A semiconductor laser gain oscillator as set forth in claim 1 wherein said second end is formed by etching an opening in the semiconductor body in the path of said electromagnetic radiation.

8. The structure of claim 7 where said first interface comprises a concave opening in the semiconductor body.

9. A semiconductor laser structure comprising:
   a) a semiconductor body having a resonant cavity formed of first and second resonant cavity sections formed in said body, said body having longitudinally extending outer surfaces, and a wave guiding layer between said outer surfaces in which layer electromagnetic radiation is generated which travels longitudinally along said cavity; said first section comprising a first interface surface and an aperture and said second section being formed of a second interface surface and said aperture;
   b) an electrically conductive contact joined to one of said outer surfaces of said semiconductor body and extending along said surface, said electrically conductive contact being tapered in two directions such that said contact is wider at the interface surfaces than at the aperture;
   c) a portion of said wave guiding layer vertically adjacent and contiguous with said contact comprising a gain region of said layer which is solely defined by said contact when a voltage is applied thereto, and
   d) a radiation remover formed longitudinally adjacent opposite sides of said aperture to receive and remove unwanted portions of the electromagnetic radiation reflected off each of said interfaces to remove such unwanted portions from the wave guiding layer.

10. The structure of claim 9 including a grating in said wave guiding layer at said aperture to feedback radiation to said first section to cause said first section to sustain generation of radiation when sufficient electrical energy is applied to said contact.

11. A laser structure comprising:
    a) a longitudinally extending body of semiconductor laser gain material having first and second vertically extending interfaces at opposite longitudinal ends thereof, and opposed outer horizontally extending surfaces of width W1, and in which body electromagnetic radiation travels longitudinally between said first and second interfaces;
    b) an electrically conductive contact adjacent to one of said outer surfaces of said body and extending between said first interface and said second interface, said electrically conductive contact being laterally tapered in opposite directions from an aperture formed between said ends such that a portion of said contact has a width W2 at each end and a width W3 at said aperture and wherein body portions vertically adjacent said contact solely laterally define a gain region of said body and wherein W1>W2>W3.

12. The structure of claim 11 including a radiation removal section for receiving a portion of the electromagnetic radiation which is reflected off said reflective surfaces and which travels laterally outside said gain region to remove said portion of electromagnetic radiation from said body.

13. The structure of claim 12 wherein the removal section comprises structures from the group comprising radiation absorbers, radiation scatters, radiation reflectors.

14. A method of forming laser oscillation comprising the steps of:
   a) providing a longitudinally extending body of semiconductor laser gain material having opposed outer longitudinally extending surfaces of width W1 which extend between vertical first and second interfaces;
   b) forming an electrically conductive contact adjacent to one of said outer surfaces of said body and extending between said interfaces, said electrically conductive contact being laterally tapered in opposite directions from an aperture located intermediate said interfaces such that a portion of said contact has a width W2 at each interface and a width W3 at the aperture; and wherein W1>W2>W3; and
   c) applying electrical energy to sad contact to form a tapered gain region in said laser gain material adjacent and contiguous with said contact, said gain region being defined solely by the tapered shape of the contact such that laser oscillation is generated producing electromagnetic radiation which travels in said gain region between said interfaces.

15. The method of claim 14 including the step of forming a radiation remover in said body.

16. The method of claim 15 wherein the radiation remover comprises a pair of oppositely directed etched grooves.

17. The method of claim 14 wherein a feedback section is formed at said aperture for feeding back radiation to sustain generation of radiation in one direction.

18. The method of claim 17 wherein a radiation remover is formed on opposite sides of the feedback section.

19. The method of claim 17 wherein the feedback section is comprised of a grating.

20. A semiconductor laser structure comprising:
   a) a semiconductor body having a resonant cavity section in one longitudinal end of said body and a single mode wave guide section formed in an opposite end of said body, said body having longitudinally extending outer surfaces, and a wave guiding layer between said outer surfaces, in which layer electromagnetic radiation travels longitudinally between two end faces;
   b) an electrically conductive contact joined to one of said outer surfaces of said semiconductor body and extending along said surface, said electrically conductive contact being tapered over the resonant cavity section such that said contact is wider at the end face than elsewhere;
   c) a portion of said wave guiding layer vertically adjacent and contiguous with said contact comprising a gain region of said layer the lateral boundaries of which are solely defined by the contact; and
   d) a radiation remover to receive and remove unwanted portions of electromagnetic radiation reflected off an end face to remove such unwanted portions from the wave guiding layer.

21. A method of forming a laser structure comprising the steps of:
   a) providing a longitudinally extended body of semiconductor laser gain material;
   b) forming first and second vertically extended interfaces at opposite longitudinal ends thereof;
   c) forming opposed outer horizontally extending surfaces in the body in which electromagnetic radiation travels between said first and second interfaces;
   d) forming an electrically conductive contact adjacent to one of said outer surfaces of said body and extending between said first interface and said second interface, said electrically conductive contact being laterally tapered such that a portion of said contact is wider at one location than at another location and wherein body portions adjacent said contact form a gain region of said body which gain region is solely defined laterally by the lateral dimensions of the contact.

22. The method of claim 21 including forming a radiation removal section on or in said body for receiving a portion of the electromagnetic radiation which is reflected off one of said interfaces and which travels laterally outside said gain region to remove said portion of electromagnetic radiation from said body.

23. The method of claim 22 wherein the removal section is formed of a radiation absorber.

24. A method as set forth in claim 23 wherein said radiation absorber is formed of reverse biased junctions formed in a wave guiding layer adjacent said gain region.

25. The method of claim 22 wherein the removal section is formed of a radiation scatterer.

26. The method of claim 22 wherein the removal section is formed of a radiation reflector.

27. The method of claim 22 wherein said removal section is formed of reflective surfaces.

28. The method of claim 22 further including wave guiding layers to vertically confine said electromagnetic radiation within said gain region and said wherein forming said removal section includes etching grooves into one or more of said wave guiding layers; said grooves defining reflective surfaces which reflect said light reflected off one of said interfaces, away from said gain region.

29. A method as set forth in claim 22 wherein said removal section extends substantially alongside said gain region between said first and second interfaces.

30. A method as set forth in claim 22 wherein forming said removal section comprises forming ion implanted regions in a guiding layer adjacent said gain region.

31. A method as set forth in claim 31 wherein said ion implanted regions extend substantially alongside said gain region between said first and second end interfaces.

32. A method as set forth in claim 22 including coating said second interface with anti-reflection material.

33. A method as set forth in claim 32 wherein said structure forms a laser oscillator and only radiation striking a center portion of said second interface produces oscillation thereby suppressing oscillation of higher modes.

34. The method as set forth in claim 21 wherein said contact is linearly tapered at a degree such that said gain region is large enough to allow electromagnetic radiation to expand in a substantially diffraction limited single-lobed beam within said gain region.

35. The method as set forth in claim 21 wherein a wave guiding layer is formed vertically adjacent said gain region to vertically confine said radiation.

36. A method of forming a semiconductor laser comprising the steps of:
   a) providing a body of semiconductor material extending along a longitudinal axis;
   b) forming first and second interfaces on said body extending transverse to said axis at opposite ends thereof;
   c) forming longitudinally extending wave guiding layers for vertically confining light radiation coupled into said body at said first interface which light travels between said layers to said second interface;

d) forming an electrically conductive contact on an outer surface on one of said layers and extending from said first end interface to said second end interface;

e) laterally tapering said electrically conductive contact in a longitudinal direction thereby defining the lateral dimensions of a laser gain region in the body opposite said contact and wherein the gain region is solely laterally defined by the contact.

37. The method of claim 36 including forming radiation removers in one of said layers positioned vertically adjacent and on laterally opposite sides of said gain region so as to receive a portion of the light radiation which is reflected off of said second interface back into said body outside said gain region and remove it from said section of semiconductor material.

38. A method as set forth in claim 37 wherein said radiation removers are formed by etching grooves into a wave guiding layer adjacent said first interface, said grooves defining reflective surfaces which reflect said light received off of said second interface outside said gain region and thereby remove it from said body.

39. A method as set forth in claim 37 wherein said radiation removers comprise radiation absorbers.

40. A method as set forth in claim 39 wherein said absorbers are formed of reverse biased junctions formed in a wave guiding layer for absorbing said radiation reflected off said second interface outside said gain region.

41. A method as set forth in claim 36 wherein said contact pad is sufficiently tapered to allow light radiation to expand in a substantially diffraction limited single-lobed beam within said gain region.

42. A semiconductor laser structure comprising:

a) a semiconductor body having a resonant cavity formed of first and second resonant cavity sections formed in said body said body having longitudinally extending outer surfaces, and a wave guiding layer between said outer surfaces in which layer electromagnetic radiation travels longitudinally along said cavity; said first section being formed of a first interface end and an aperture and said second section being formed of a second interface end and said aperture;

b) an electrically conductive contact joined to one of said ends of said semiconductor body and extending along one said outer surface, said electrically conductive contact being tapered in two directions such that said contact is wider at the ends than at the aperture; c) a portion of said wave guiding layer vertically adjacent and contiguous with said contact comprising a gain region of said layer;

d) a space in said contact at said aperture;

e) a grating comprised of grooves etched into the outer surface and into said guiding layer adjacent said space.

* * * * *

UNITED STATES PATENT AND TRADEMARK OFFICE
CERTIFICATE OF CORRECTION

PATENT NO. : 5,555,544
DATED : September 10, 1996
INVENTOR(S) : Chinn, et. al.

It is certified that error appears in the above-indentified patent and that said Letters Patent is hereby corrected as shown below:

Title page, item [75], inventors: fifth inventor's name should read-- Leo--.

Claim 31, Column 14, line 39, delete "31" and insert in its place-- 30--.

Signed and Sealed this

Twenty-sixth Day of November 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,555,544
DATED : September 10, 1996
INVENTOR(S) : James N. Walpole, Emily S. Kintzer, Stephen R. Chinn, Christine A. Wang and Leo J. Missaggia It is certified that error appears in the above-indentified patent and that said Letters Patent is hereby corrected as shown below:

Title Page, Subsection [75] Inventors, correct the fifth inventor's name by deleting "Lee" and inserting in its place ---Leo---.

Claim 31, Column 14, line 39, delete "31" and insert in its place ---30---.

This certificate supersedes Certificate of Correction issued November 26, 1996.

Signed and Sealed this

Seventeenth Day of June, 1997

Attest:

BRUCE LEHMAN

Attesting Officer

Commissioner of Patents and Trademarks